(12) United States Patent
Mesuda et al.

(10) Patent No.: US 12,392,025 B2
(45) Date of Patent: Aug. 19, 2025

(54) METHOD FOR PRODUCING CHROMIUM SINTERED BODY, METHOD FOR PRODUCING SPUTTERING TARGET, AND METHOD FOR PRODUCING SUBSTRATE WITH CHROMIUM FILM

(71) Applicants: TOSOH CORPORATION, Shunan (JP); TOSOH SPECIALITY MATERIALS CORPORATION, Yamagata (JP)

(72) Inventors: Masami Mesuda, Ayase (JP); Daiki Shono, Ayase (JP); Kenichi Itoh, Yamagata (JP); Koichi Hanawa, Yamagata (JP)

(73) Assignees: TOSOH CORPORATION, Yamaguchi (JP); TOSOH SPECIALITY MATERIALS CORPORATION, Yamagata (JP)

( * ) Notice: Subject to any disclaimer, the term of this patent is extended or adjusted under 35 U.S.C. 154(b) by 0 days.

(21) Appl. No.: 18/180,132

(22) Filed: Mar. 8, 2023

(65) Prior Publication Data

US 2023/0287560 A1    Sep. 14, 2023

(30) Foreign Application Priority Data

Mar. 10, 2022   (JP) ................. 2022-037003

(51) Int. Cl.
*C23C 14/34*     (2006.01)
*C23C 14/14*     (2006.01)

(52) U.S. Cl.
CPC .......... *C23C 14/3414* (2013.01); *C23C 14/14* (2013.01)

(58) Field of Classification Search
None
See application file for complete search history.

(56) References Cited

U.S. PATENT DOCUMENTS 5,778,302 A    7/1998   Ivanov

FOREIGN PATENT DOCUMENTS

| CN | 111230096 A | 6/2020 | |
|---|---|---|---|
| EP | 482808 A * | 4/1992 | ............ C22B 34/32 |
| EP | 1069204 A1 | 1/2001 | |
| EP | 3910090 A1 | 11/2021 | |
| JP | H0819506 B2 * | 2/1996 | |
| JP | 2015196885 A * | 11/2015 | |
| KR | 10-2021-0111671 A | 9/2021 | |
| WO | 2020/144913 A1 | 7/2020 | |

OTHER PUBLICATIONS

Chang Shih-Hsien et al, "Sintered Behaviors and Electrical Properties of Cr50Cu50 Alloy Targets via Vacuum Sintering and HIP Treatments", Materials Transactions, Sep. 1, 2012, p. 1689-p. 1694, XP093059779, 6pp.
Chang Shih-Hsien et al, "Study on the microstructures, electrical resistance and mechanical properties of sputtering chromium target by HP, HIP and canning-HIP processes", International Journal of Refractory Metals and Hard Materials, vol. 35, Nov. 1, 2012, p. 70-p. 75, XP093059065, 6pp.

* cited by examiner

*Primary Examiner* — Jason Berman
(74) *Attorney, Agent, or Firm* — HAUPTMAN HAM, LLP

(57) ABSTRACT

A method for producing a chromium sintered body includes a heat treatment step of heat-treating electrolytic chromium flakes at 1,200° C. or higher and 1,400° C. or lower, and a firing step of, after the heat treatment step, filling a container with the electrolytic chromium flakes and firing a resulting filling product by hot isostatic pressing.

19 Claims, 8 Drawing Sheets

METHOD FOR PRODUCING CHROMIUM SINTERED BODY, METHOD FOR PRODUCING SPUTTERING TARGET, AND METHOD FOR PRODUCING SUBSTRATE WITH CHROMIUM FILM

RELATED APPLICATIONS

The present application claims priority based on Japanese Patent Applications No. 2022-037003, filed Mar. 10, 2022. The contents of the application are incorporated herein by reference in its entirety.

TECHNICAL FIELD

The present disclosure relates to a chromium sintered body, a method for producing the chromium sintered body, a sputtering target, a method for producing the sputtering target, and a method for producing a substrate with a chromium film.

BACKGROUND

Chromium sputtering targets (hereinafter, also simply referred to as "targets") are widely used for forming chromium films. Chromium films may be formed in, for example, mask blanks, which are base materials of photomasks for semiconductors. If a target has a high oxygen content, in the case of forming a chromium film by a sputtering method, impurity particles composed of a metal oxide and called "particles" may be generated and mixed in the chromium film. Such particles may cause short-circuit in fine wiring formed using mask blanks. For this reason, it is desirable to reduce the oxygen content in targets.

For example, Japanese Unexamined Patent Publication No. 2015-196885 discloses an ultra-low oxygen/ultra-high purity chromium target whose oxygen content is reduced to 30 ppm or less.

SUMMARY

The target disclosed in Japanese Unexamined Patent Publication No. 2015-196885 has the following problem.

Specifically, although the target disclosed in Japanese Unexamined Patent Publication No. 2015-196885 has a low oxygen content, the target has room for improvement in terms of thickness uniformity of a chromium film when the chromium film is formed by a sputtering method.

The present disclosure has been made in view of the above problem. An object of the present disclosure is to provide a chromium sintered body that has a low oxygen content and that enables the production of a sputtering target with which thickness uniformity of a chromium film can be improved when the chromium film is formed by a sputtering method, a method for producing the chromium sintered body, a sputtering target, a method for producing the sputtering target, and a method for producing a substrate with a chromium film.

The present inventors have found that the above problem can be solved by the following disclosure.

Specifically, the scope of the present invention is defined by the claims, and the gist of the present disclosure is as follows.

<1> A method for producing a chromium sintered body, the method including:
a heat treatment step of heat-treating electrolytic chromium flakes at 1,200° C. or higher and 1,400° C. or lower; and
a firing step of, after the heat treatment step, filling a container with the electrolytic chromium flakes and firing a resulting filling product by hot isostatic pressing.

<2> The method for producing a chromium sintered body according to <1>, in which the electrolytic chromium flakes are unground electrolytic chromium flakes.

<3> The method for producing a chromium sintered body according to <1> or <2>, in which the electrolytic chromium flakes have an average particle size of 250 µm or more.

<4> The method for producing a chromium sintered body according to any one of <1> to <3>, in which the electrolytic chromium flakes have an oxygen content of 100 ppm by mass or less.

<5> The method for producing a chromium sintered body according to any one of <1> to <4>, in which the electrolytic chromium flakes have a metal impurity content of 130 ppm by mass or less.

<6> The method for producing a chromium sintered body according to any one of <1> to <5>, in which the heat treatment step includes heat-treating the electrolytic chromium flakes at 1,200° C. or higher and 1,300° C. or lower.

<7> The method for producing a chromium sintered body according to any one of <1> to <6>, in which, in the heat treatment step, an atmosphere of heat treatment is an inert gas atmosphere.

<8> The method for producing a chromium sintered body according to any one of <1> to <6>, in which, in the heat treatment step, an atmosphere of heat treatment is an argon atmosphere.

<9> The method for producing a chromium sintered body according to any one of <1> to <8>, in which, in the firing step, a firing temperature of the filling product is T1−100 (° C.) or higher and T1+100 (° C.) or lower, where T1 (° C.) represents a heating temperature of the electrolytic chromium flakes in the heat treatment step.

<10> The method for producing a chromium sintered body according to any one of <1> to <9>, in which a pressure in the firing step is 50 MPa or more.

<11> The method for producing a chromium sintered body according to any one of <1> to <10>, in which a holding time in the firing step is one hour or more.

<12> The method for producing a chromium sintered body according to any one of <1> to <11>, in which, in the firing step, a filling density of the electrolytic chromium flakes in the container is 50% or more.

<13> The method for producing a chromium sintered body according to any one of <1> to <12>,
in which the chromium sintered body includes grains, the grains have an average KAM value of 2° or less, and the grains have an average grain size of more than 150 µm and 400 µm or less.

<14> The method for producing a chromium sintered body according to any one of <1> to <13>, in which the chromium sintered body has an oxygen content of 100 ppm by mass or less and a relative density of higher than 99.6%.

<15> The method for producing a chromium sintered body according to any one of <1> to <14>, in which the chromium sintered body has a Vickers hardness of 100 HV or more.

<16> The method for producing a chromium sintered body according to any one of <1> to <15>, in which the chromium sintered body has a total metal impurity content of 100 ppm by mass or less.

<17> The method for producing a chromium sintered body according to any one of <13> to <16>, in which the grains have an average aspect ratio of 1 or more and 1.8 or less.

<18> A method for producing a sputtering target, the method including a step of producing a chromium sintered body by the method for producing a chromium sintered body according to any one of <1> to <17>.

<19> A method for producing a substrate with a chromium film, the method including forming a chromium film on a substrate by a sputtering method using a sputtering target obtained by the method for producing a sputtering target according to <18> to produce a substrate with a chromium film.

(1) A chromium sintered body including grains, in which the grains have an average KAM value of 2° or less, and the grains have an average grain size of more than 150 μm and 400 μm or less.

(2) The chromium sintered body according to (1), having an oxygen content of 100 ppm by mass or less and a relative density of more than 99.6%.

(3) The chromium sintered body according to (1) or (2), having a Vickers hardness of 100 HV or more.

(4) The chromium sintered body according to any one of (1) to (3), having a total metal impurity content of 100 ppm by mass or less.

(5) A method for producing the chromium sintered body according to any one of (1) to (4), the method including:

a heat treatment step of heat-treating electrolytic chromium flakes at 1,200° C. or higher and 1,400° C. or lower; and a firing step of, after the heat treatment step, filling a container with the electrolytic chromium flakes and firing a resulting filling product by hot isostatic pressing.

(6) A sputtering target including the chromium sintered body according to any one of (1) to (4).

(7) A method for producing a substrate with a chromium film, the method including forming a chromium film on a substrate by a sputtering method using the sputtering target according to (6) to produce a substrate with a chromium film.

According to (1), it is possible to produce a sputtering target with which thickness uniformity of a chromium film can be improved when the chromium film is formed by a sputtering method, and a low oxygen content can also be achieved.

According to (2), since the relative density of the chromium sintered body is higher than 99.6%, in the formation of a chromium film by a sputtering method using a target obtained with this chromium sintered body, abnormal discharge or generation of particles can be suppressed to improve the quality of the chromium film. In addition, since the oxygen content of the chromium sintered body is 100 ppm by mass or less, it is possible to produce a target with which entry of oxygen in a chromium film can be reduced during film deposition to suppress the generation of particles due to entry of oxygen. Furthermore, it is also possible to produce a target that can form a chromium film having higher crystallinity According to (3), it is possible to suppress the generation of cracks in a target due to stress on a target surface caused by an increase in the temperature of the surface due to collision of plasma during sputtering and to suppress the generation of particles.

According to (4), in a target obtained using the chromium sintered body, embrittlement of grain boundaries of grains due to metal impurities can be further suppressed to further improve the strength of the target, and the generation of particles can be suppressed when a chromium film is formed by a sputtering method.

According to (5), the above chromium sintered body can be effectively produced.

According to (6), since the sputtering target according to the present disclosure includes the above chromium sintered body, in the formation of a chromium film by a sputtering method, a chromium film having a low oxygen content can be formed, and thickness uniformity of the chromium film can be improved.

According to (7), since the above sputtering target is used, in the formation of a chromium film on a substrate by a sputtering method, a chromium film having a low oxygen content can be formed, and thickness uniformity of the chromium film can be improved.

According to the present disclosure, there are provided a chromium sintered body that has a low oxygen content and that enables the production of a sputtering target with which thickness uniformity of a chromium film can be improved when the chromium film is formed by a sputtering method, a method for producing the chromium sintered body, a sputtering target, a method for producing the sputtering target, and a method for producing a substrate with a chromium film.

DETAILED DESCRIPTION

Figure 1:
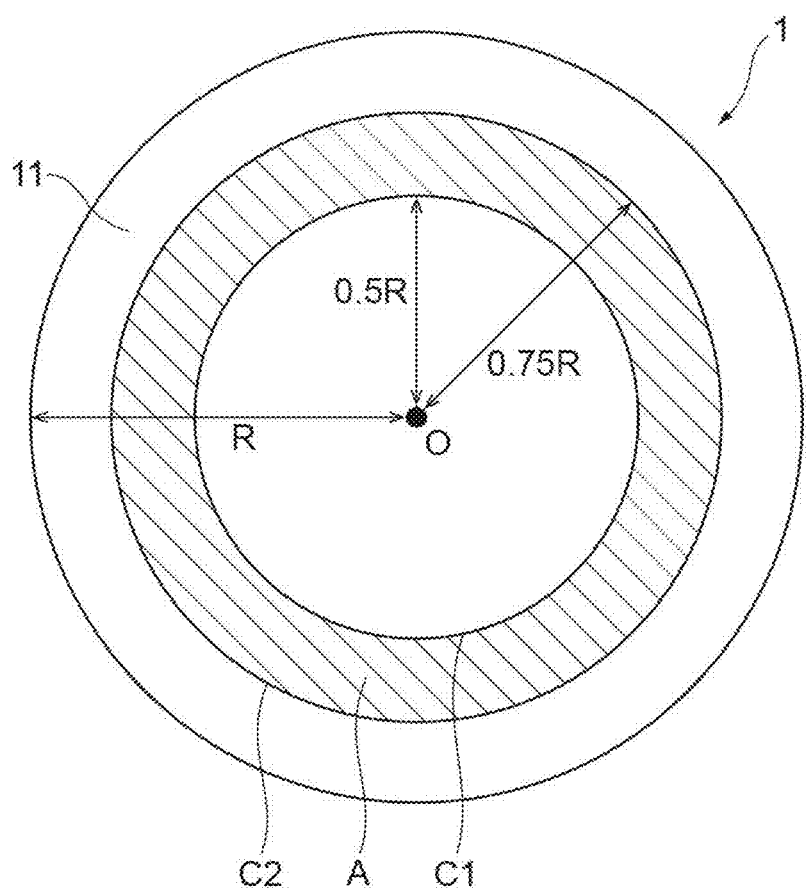
FIG. 1 is a schematic top view of a sintered body for illustrating an observation region A.

The present disclosure will be described in detail with reference to an embodiment; however, the present disclosure is not limited to the following embodiment.

<Chromium Sintered Body>

A chromium sintered body according to the present disclosure is a sintered body containing chromium as a matrix (main phase), and furthermore, a sintered body that is mainly constituted by grains (crystal grains) of chromium, and may be a sintered body constituted by grains composed of crystal grains of chromium alone.

The chromium sintered body according to the present disclosure includes grains, in which the grains have an average KAM value of 2° or less, and the grains have an average grain size of more than 150 μm and 400 μm or less.

The chromium sintered body according to the present disclosure enables the production of a sputtering target which has a low oxygen content and with which thickness uniformity of a chromium film can be improved when the chromium film is formed by a sputtering method.

Hereinafter, the chromium sintered body will be described in detail.

(Average Grain Size)

The grains constituting the chromium sintered body have an average grain size of more than 150 μm and 400 μm or less. When the average grain size of the grains is more than 150 μm and 400 μm or less, a target having a low oxygen content can be produced. In addition, during sputtering, abnormal discharge can be suppressed to stably cause discharging. The average grain size of the grains is more preferably 200 μm or more and 400 μm or less, still more preferably 230 μm or more and 350 μm or less, and particularly preferably 250 μm or more and 300 μm or less. The average crystal grain size (average grain size) can be determined by a method based on the intercept method described in appendix C of JIS G 0551:2013 and is a value determined from the average line segment length per crystal grain of a line segment passing through crystal grains that constitute a chromium sintered body or a target while the microstructure of the chromium sintered body or the target is observed. Alternatively, the average grain size may be determined as follows. A section of the microstructure of a chromium sintered body or a target is polished and subjected to electrolytic etching. For grains observed at 100 or more points (preferably 120±20 points), grain sizes are measured by a diameter measurement method, and a grain size distribution of grain sizes is prepared on the basis of the measured grain sizes. In this case, the median (D50) in the grain size distribution may be determined as the average grain size. The method for observing the microstructure of a chromium sintered body or a target may be, for example, a method of observation using an optical microscope or an electron microscope.

(Average Aspect Ratio)

An average aspect ratio of the grains constituting the chromium sintered body is not particularly limited but is preferably 1 or more and 1.8 or less, more preferably 1.0 or more and 1.6 or less, and still more preferably 1.05 or more and 1.2 or less. The "aspect ratio" refers to a value of long axis/short axis determined when a grain constituting a chromium sintered body is approximated by an ellipse, and is a parameter that represents the isotropy of the grain shape. When the average aspect ratio of the grains is 1 or more, irregularities of the target surface during film deposition are reduced, and particles are reduced. On the other hand, when the average aspect ratio of the grains is 1.8 or less, the strength of the microstructure of the sintered body in the in-plane direction increases, and cracking of the target during film deposition can be suppressed. In addition, when the average aspect ratio is 1 or more and 1.8 or less, the deposition rate is further stabilized when a chromium film is formed by a sputtering method. The average aspect ratio is a value determined by observing the microstructure of a sintered body with SEM-EBSD (scanning electron microscope-electron backscatter diffraction detector, for example, SEM: manufactured by JEOL Ltd., EBSD: manufactured by Oxford Instruments) under the following measurement conditions and using the following programs, calculating numerical values of long axis/short axis in the case where all grains observed without discontinuation of their contours are approximated by ellipses, and determining the arithmetic mean of the numerical values. The number of grains observed is 100 or more, preferably 150±20.

(Measurement Conditions)

Beam conditions: Accelerating voltage 20 kV, Incident beam current 100 μA

Work distance: 10 mm

Step width: 5 μm (Programs Used)

Measurement program: AZtec

Analysis program: AZtec Crystal (Average KAM Value)

An average KAM value in the chromium sintered body is 2° or less. KAM (Kernel Average Misorientation) is a parameter representing residual strain in grains and indicates that the larger the value, the larger residual strain in grains (crystal grains). When the average KAM value is 2° or less, strain inside the chromium sintered body is reduced, and nonuniformity of the thickness of a chromium film due to stress release is suppressed during sputtering. As a result, uniformity of the thickness of the chromium film is improved. From the viewpoint of improving uniformity of the thickness of the chromium film, the average KAM value is preferably 1.8° or less, and more preferably 1.2° or less. The average KAM value may be 1.0° or less, 0.8° or less, 0.6° or less, 0.5° or less, 0.4° or less, or 0.3° or less.

The average KAM value may be more than 0°, 0.10° or more, or 0.20° or more. A particularly preferred average KAM value is, for example, more than 0° and 2° or less, 0.10° or more and 1.0° or less, 0.1° or more and 0.5° or less, 0.1° or more and 0.3° or less, or 0.20° or more and 0.3° or less.

The "average KAM value" refers to a value determined by, for a measurement portion B in an observation region A in a section of a sintered body, observing the microstructure of the sintered body with SEM-EBSD (SEM: manufactured by JEOL Ltd., EBSD: manufactured by Oxford Instruments) under the above measurement conditions and using the above programs, subsequently measuring KAM values in all grains observed without discontinuation of their contours in the measurement portion B, and determining the arithmetic mean of the KAM values. The number of grains observed is 100 or more, preferably 150±20.

Here, the observation region A and the measurement portion B will be described with reference to FIGS. 1 and 2.

Figure 2:
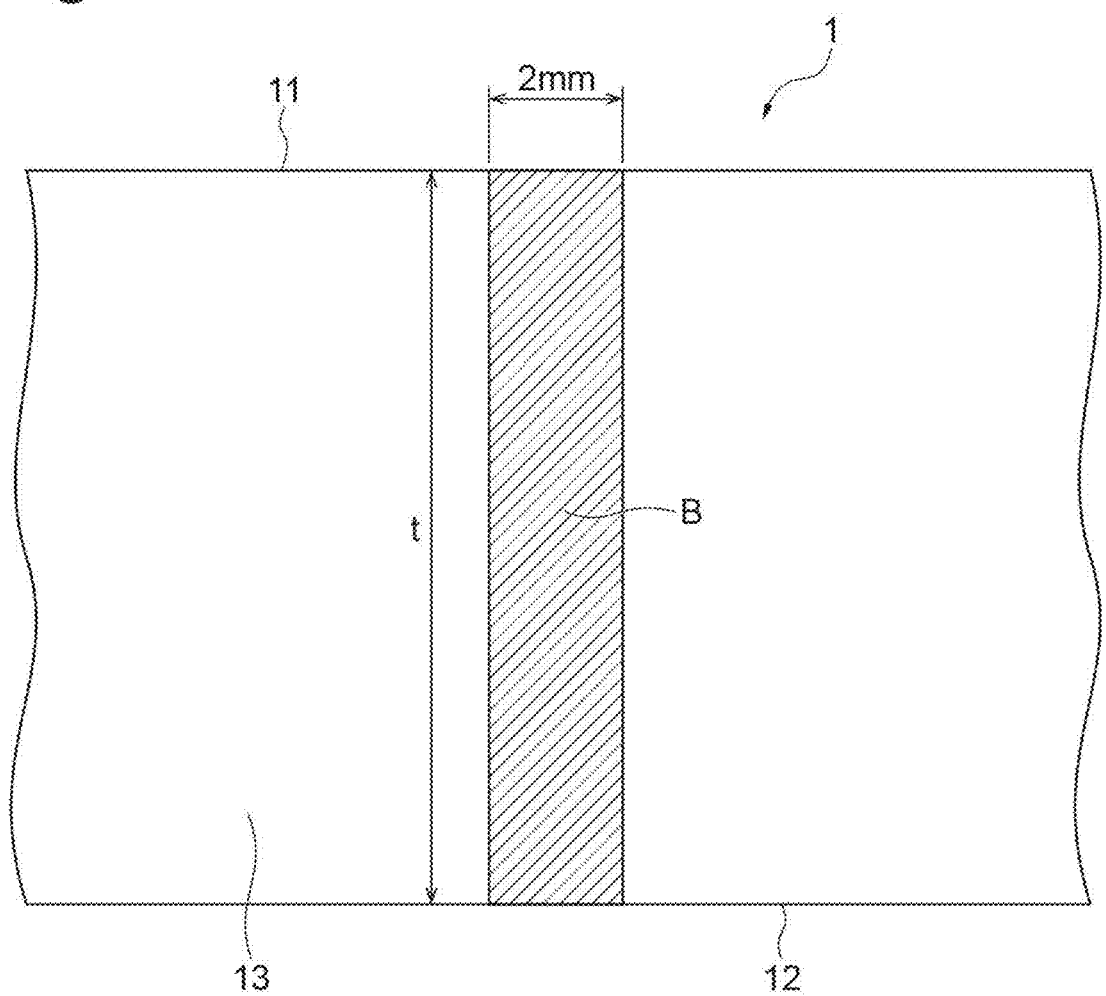
FIG. 2 is a schematic sectional view of a sintered body for illustrating a measurement portion B.

FIGS. 1 and 2 are schematic views of a sintered body. FIG. 1 is a schematic top view of the sintered body for illustrating the observation region A, and FIG. 2 is a schematic sectional view of the sintered body for illustrating the measurement portion B. Although the shape of the sintered body is not particularly limited, in FIGS. 1 and 2, the description will be made on the assumption that the sintered body has a disk shape. As illustrated in FIG. 2, a front surface 11 and a back surface 12, which are end surfaces of the sintered body, correspond to flat surfaces of the disk.

As illustrated in FIG. 1, an annular region on a circular front surface 11 of a sintered body 1 is the observation region A. Specifically, when the distance from the center O of the circle to the outer circumference thereof (the radius of the circular front surface 11) is denoted by R, the observation region A is the hatched region between a circumference C1 of a circle centered on O and having a radius of 0.5R and a circumference C2 of a circle centered on O and having a radius of 0.75R.

Figure 3:
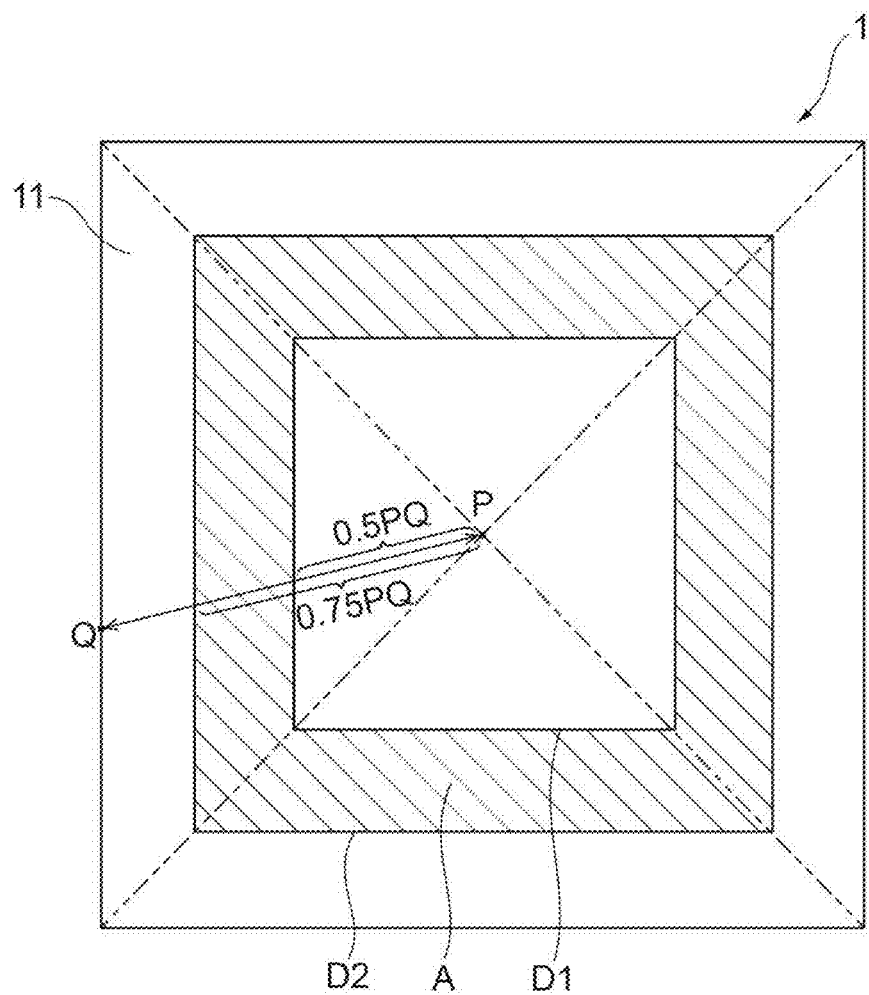
FIG. 3 is a schematic top view of a sintered body having an end surface shape different from that in FIG. 1.

In the case where the front surface 11 of the sintered body has a quadrangular shape as illustrated in FIG. 3, when the distance from the intersecting point P of the diagonal lines to a point Q on the outer periphery of the quadrangle (outer peripheral edge of the front surface 11) is denoted by PQ, the observation region A is the hatched region between a peripheral edge D1 of a quadrangle in which the distance from P to the outer periphery is 0.5PQ, where P denotes the intersecting point of the diagonal lines of the front surface 11, and a peripheral edge D2 of a quadrangle in which the distance from P to the outer periphery is 0.75PQ, where P denotes the intersecting point of the diagonal lines.

Figure 4:
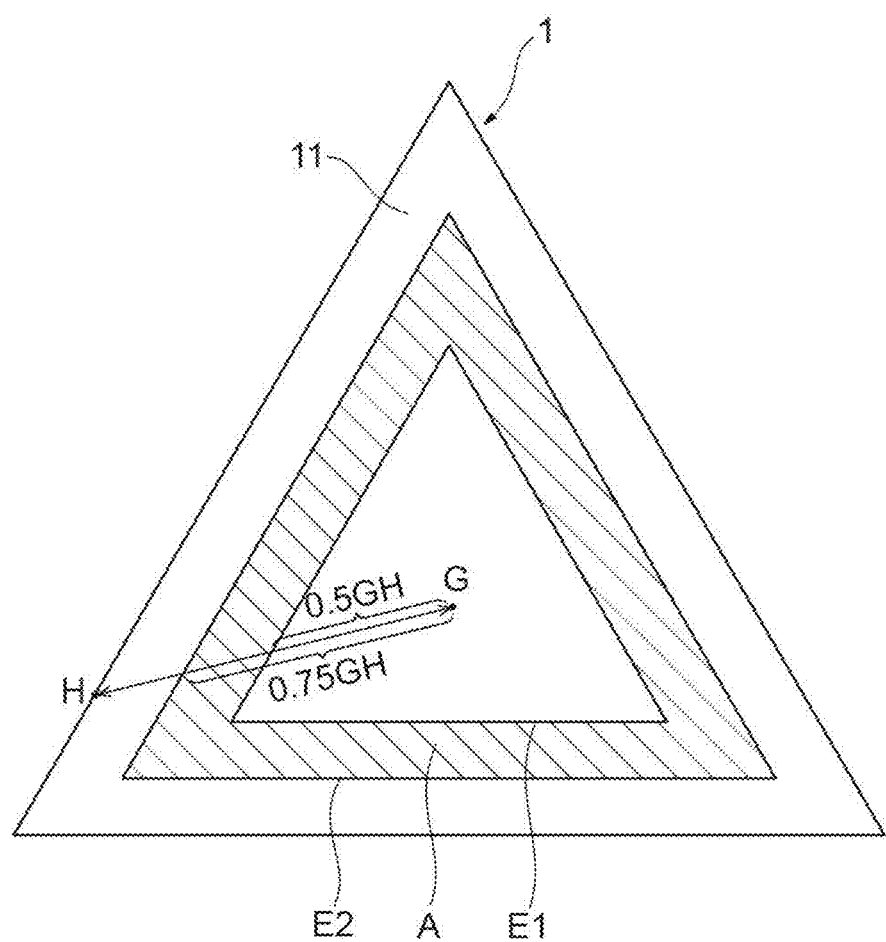
FIG. 4 is a schematic top view of a sintered body having an end surface shape different from those in FIGS. 1 and 3.

In the case where the front surface 11 of the sintered body has another planar shape (for example, a triangular shape) as illustrated in FIG. 4, the observation region A is the hatched region between a peripheral edge E1 of a region that has, as a center of gravity thereof, a point G serving as the center of gravity of the planar shape in the front surface 11 of the sintered body and that is similar to the planar shape with a ratio of similitude of 0.5, and a peripheral edge E2 of a region that has, as a center of gravity thereof, the point G serving as the center of gravity of the planar shape in the front surface 11 of the sintered body and that is similar to the planar shape with a ratio of similitude of 0.75. In this case, when the length of a line segment connecting a point H on the peripheral edge of the front surface 11 and the center of gravity G is denoted by GH, the distance from the center of gravity G to the peripheral edge E1 along the line segment is 0.5GH, and the distance from the center of gravity G to the peripheral edge E2 along the line segment is 0.75GH.

Meanwhile, the measurement portion B is, of the observation region A in a section 13 of the sintered body 1, a region of 2 mm in width×t (mm) in overall thickness (see FIG. 2).

(Relative Density)

The chromium sintered body preferably has a relative density of higher than 99.6%. When the relative density of the chromium sintered body is higher than 99.6%, in the formation of a chromium film by a sputtering method, abnormal discharge or generation of particles can be suppressed to further improve the quality of the chromium film. The relative density of the chromium sintered body is more preferably 99.7% or more, and particularly preferably 99.9% or more. The relative density is preferably high but may be 100% or less, and the relative density of the chromium sintered body according to the present disclosure is preferably higher than 99.6% and 100% or lower, or 99.8% or higher and 100% or lower. The relative density of the chromium sintered body can be measured by the following method. Specifically, a measured density of the chromium sintered body is measured in accordance with JIS R 1634, and the measured density is divided by the true density of chromium to calculate the relative density. In the present embodiment, the true density of chromium may be 7.19 g/cm$^3$.

(Oxygen Content)

The chromium sintered body preferably has an oxygen content of 100 ppm by mass or less, more preferably 30 ppm by mass or less, and still more preferably 20 ppm by mass or less. When the oxygen content of the chromium sintered body is 100 ppm by mass or less, entry of oxygen in a chromium film is reduced during film deposition. This enables the production of a target with which the generation of particles due to entry of oxygen can be suppressed. Furthermore, because of the low oxygen content, a target that enables the formation of a sputtered film having higher crystallinity can be produced.

The oxygen content is preferably low but may be 0.1 ppm by mass or more, 2 ppm by mass or more, or 5 ppm by mass or more.

A preferred oxygen content is, for example, 0.1 ppm by mass or more and 100 ppm by mass or less, 0.1 ppm by mass or more and 30 ppm by mass or less, or 2 ppm by mass or more and 20 ppm by mass or less.

The oxygen content is a value measured with an oxygen/nitrogen analyzer (for example, ON736, manufactured by LECO Corporation).

(Vickers Hardness)

The chromium sintered body preferably has a Vickers hardness of 100 HV or more. In this case, cracking of the target due to the generation of surface stress caused by collision of plasma during sputtering can be suppressed, and the generation of particles can be suppressed.

The Vickers hardness of the chromium sintered body is more preferably 110 HV or more, and particularly preferably 120 HV or more.

The Vickers hardness of the chromium sintered body is preferably 180 HV or less, more preferably 150 HV or less, and still more preferably 130 HV or less. A preferred Vickers hardness is, for example, 100 HV or more and 180 HV or less, 110 HV or more and 150 HV or less, or 110 HV or more and 130 HV or less.

The Vickers hardness can be measured by a method according to JIS-Z-2244-1:2009. The conditions for measuring the Vickers hardness are, for example, as follows.

Measurement sample: 5±0.5 mm (sample thickness)
Measuring load: 10 kgf (Metal Impurity Content)

The chromium sintered body may have a total metal impurity content of 150 ppm by mass or less, and 100 ppm by mass or less.

The total metal impurity content in the chromium sintered body is preferably 100 ppm by mass or less. In this case, embrittlement of grain boundaries of grains due to metal impurities can be further suppressed to further improve the strength of the target, and consequently, the generation of particles can be suppressed when a chromium film is formed by a sputtering method.

The chromium sintered body may contain metal impurities as long as a target having a practical strength is obtained, and the total metal impurity content in the chromium sintered body is, for example, 0 ppm by mass or more, 20 ppm by mass or more, 50 ppm by mass or more, or 80 ppm by mass or more. The total metal impurity content in the chromium sintered body according to the present disclosure is, for example, 0 ppm by mass or more and 150 ppm by mass or less, 50 ppm by mass or more and 150 ppm by mass or less, or 80 ppm by mass or more and 100 ppm by mass or less.

The metal impurities are metals other than chromium (Cr) and may be composed of Fe, Al, Si, and Cu. Note that the total metal impurity content in the present disclosure is a total content of Li, Be, B, Na, Mg, Al, Si, P, K, Ca, Sc, Ti, V, Mn, Fe, Co, Ni, Cu, Zn, Ga, Ge, As, Se, Br, Rb, Sr, Y, Zr, Nb, Mo, Ru, Rh, Pd, Ag, Cd, In, Sn, Sb, Te, Cs, Ba, La, Ce, Pr, Nd, Sm, Eu, Gd, Tb, Dy, Ho, Er, Tm, Yb, Lu, Hf, Ta, W, Re, Os, Ir, Pt, Au, Hg, Tl, Pb, Bi, Th, and U.

Although the amount of metal impurities is preferably small, the ranges of the contents of individual metal impurities may be, for example, as follows.

The Fe content may be 0.5 ppm by mass or more and 40 ppm by mass or less, or 0.5 ppm by mass or more and 25 ppm by mass or less.

The Pb content may be 0.05 ppm by mass or more and 1 ppm by mass or less, or 0.05 ppm by mass or more and 0.3 ppm by mass or less.

The Ca content may be 5 ppm by mass or less or 3 ppm by mass or less, and is preferably 0 ppm by mass or more and 1.2 ppm by mass or less, and more preferably 0 ppm by mass or more and 1 ppm by mass or less.

The Mg content may be 5 ppm by mass or less or 3 ppm by mass or less, and is preferably 0 ppm by mass or more and 5 ppm by mass or less, and more preferably more than 0 ppm by mass and 0.1 ppm by mass or less.

The Na content may be 10 ppm by mass or less, 5 ppm by mass or less, or 3 ppm by mass or less, and is preferably 0 ppm by mass or more and 8 ppm by mass or less, or more than 0 ppm by mass and 5 ppm by mass or less.

The K content may be 5 ppm by mass or less or 3 ppm by mass or less, and is preferably 0 ppm by mass or more and 5 ppm by mass or less, or more than 0 ppm by mass and 1 ppm by mass or less.

Preferred ranges of the contents of individual non-metal impurities are as follows. Examples of non-metal impurities include sulfur, carbon, oxygen, hydrogen, and chlorine. Note that, in the present specification, oxygen is not included in non-metal impurities for the sake of convenience because the influence of oxygen is larger than that of sulfur, carbon, or the like.

The sulfur content may be, for example, 0.1 ppm by mass or more and 30 ppm by mass or less, or 0.1 ppm by mass or more and 20 ppm by mass or less.

The carbon content may be, for example, 0.1 ppm by mass or more and 30 ppm by mass or less, or 0.1 ppm by mass or more and 20 ppm by mass or less.

<Method for Producing Chromium Sintered Body>

A method for producing a chromium sintered body according to the present disclosure includes a heat treatment step of heat-treating electrolytic chromium flakes at 1,200° C. or higher and 1,400° C. or lower; and a firing step of, after the heat treatment step, filling a container with the electrolytic chromium flakes and firing the resulting filling product by HIP (hot isostatic pressing).

According to the above production method, the chromium sintered body described above can be effectively produced.

The heat treatment step and the firing step will be described in detail below.

(Heat Treatment Step)

Through the heat treatment step, the state of electrolytic chromium flakes becomes suitable for use in the firing step. The electrolytic chromium flakes used in the heat treatment step are formed of flaky metal chromium that has been subjected to electrolytic refining.

The electrolytic chromium flakes may be unground electrolytic chromium flakes or ground electrolytic chromium flakes, but are preferably unground electrolytic chromium flakes. In this case, oxidation of electrolytic chromium flakes due to grinding energy, mixing of impurities from grinding media into electrolytic chromium flakes, and strain in electrolytic chromium flakes caused by grinding are prevented. Therefore, it is also possible to produce a chromium sintered body that enables the production of a target which has a reduced oxygen content and a reduced impurity content and with which nonuniformity of the thickness of a chromium film due to stress release is suppressed when the chromium film is formed by a sputtering method.

An average particle size of the electrolytic chromium flakes is not particularly limited but is preferably 250 μm or more, more preferably 5,000 μm or more, and still more preferably 10,000 μm or more. The average particle size of the electrolytic chromium flakes is preferably 100,000 μm or less, and more preferably 50,000 μm or less. A preferred average particle size is, for example, 250 μm or more and 10 cm or less, 1 mm or more and 15 mm or less, or 5 mm or more and 15 mm or less.

The average particle size of the electrolytic chromium flakes is determined from the median particle size when the raw material is sieved through a multi-stage sieve on the basis of JISZ8815.

The oxygen content of the electrolytic chromium flakes is preferably 100 ppm by mass or less, more preferably 30 ppm by mass or less, still more preferably 20 ppm by mass or less, even still more preferably 10 ppm by mass or less, and particularly preferably 7 ppm by mass or less. The reduction of the oxygen content of the electrolytic chromium flakes enables the oxygen content of the target to be reduced. The oxygen content is preferably low but may be more than 0 ppm by mass, and may be 1 ppm by mass or more. A preferred oxygen content of the electrolytic chromium flakes is, for example, more than 0 ppm by mass and 100 ppm by mass or less, more than 0 ppm by mass and 30 ppm by mass or less, or 1 ppm by mass or more and 20 ppm by mass or less.

The oxygen content is a value measured with an oxygen/nitrogen analyzer (for example, ON736, manufactured by LECO Corporation).

The metal impurity content in the electrolytic chromium flakes is preferably 130 ppm by mass or less, and more preferably 100 ppm by mass or less. The reduction of the metal impurity content in the electrolytic chromium flakes enables the impurity content of the target to be reduced. The metal impurity content is preferably low but may be more than 0 ppm by mass, and may be 1 ppm by mass or more, 10 ppm by mass or more, or 50 ppm by mass or more. A preferred metal impurity content is, for example, more than 0 ppm by mass and 130 ppm by mass or less, or 50 ppm by mass or more and 130 ppm by mass or less.

The electrolytic metal chromium flakes preferably have a high purity of chromium, and the purity of the electrolytic metal chromium flakes is preferably 99.95% (3N5) or more, and more preferably 99.99% (4N) or more. In particular, when the electrolytic chromium flakes have an average particle size of 250 μm or more, the specific surface area of the chromium sintered body obtained can be reduced to achieve a low oxygen content. Subsequently, by performing the firing by HIP, a low oxygen/high purity chromium target whose oxygen content is reduced can be produced without impairing the quality of high-purity, low-oxygen metal chromium used as a starting raw material.

A heating temperature T1 of the electrolytic chromium flakes is 1,200° C. or higher and 1,400° C. or lower. When the heating temperature T1 is within this temperature range, residual stress in the flakes generated during electrolytic deposition can be relaxed to reduce strain in the chromium sintered body obtained. Furthermore, by performing the heat treatment, the electrolytic chromium flakes are easily loaded in a can for HIP to increase the filling density in the can during HIP.

The heating temperature T1 is preferably 1,200° C. or higher and 1,300° C. or lower.

The heating time is not particularly limited but is preferably one hour or more, and more preferably three hours or more from the viewpoint of reducing strain. The heating time may be appropriately adjusted depending on, for example, the amount of starting raw material provided for the heat treatment. In view of productivity of the chromium sintered body, the heating time is preferably 15 hours or less, more preferably 10 hours or less, and still more preferably 7 hours or less, and may be, for example, 1 hour or more and 15 hours or less, or 3 hours or more and 10 hours or less.

The heat treatment is preferably performed in an atmosphere of an inert gas or in vacuum. In this case, oxidation of electrolytic flakes can be suppressed to suppress an increase in the oxygen content.

The "inert gas" refers to nitrogen or a rare gas such as argon. The inert gas is preferably argon. The atmosphere of the heat treatment is preferably an inert gas atmosphere, and more preferably an argon atmosphere.

(Firing Step)

Figure 5:
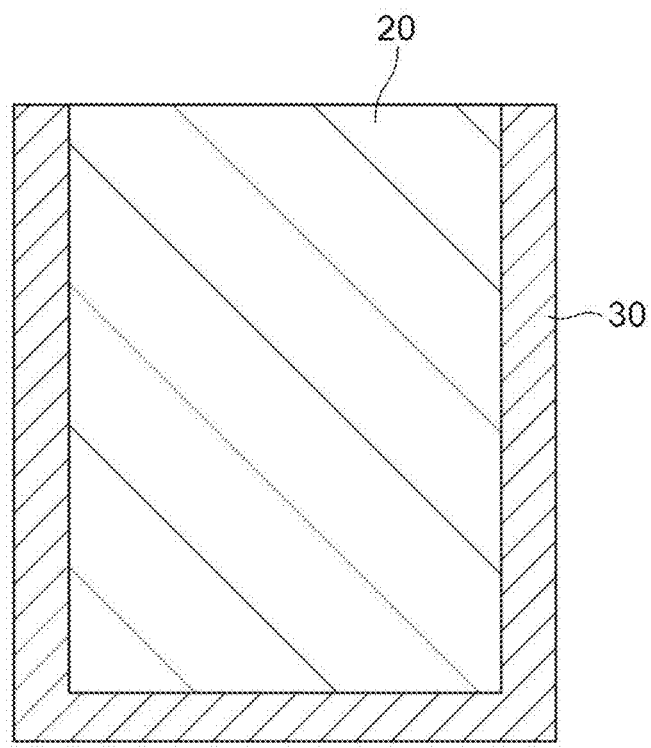
FIG. 5 is a sectional view illustrating a container filled with electrolytic chromium flakes serving as a filling product.

The firing step is a step of filling a container with the electrolytic chromium flakes after the heat treatment step and firing the resulting filling product by HIP at a firing temperature T2. FIG. 5 is a sectional view illustrating a container filled with electrolytic chromium flakes serving as a filling product. A filling product 20 composed of electrolytic chromium flakes is fired by HIP in a state of being loaded in a container 30.

The container 30 is, for example, a can made of soft iron.

In the firing step, the filling density of the starting raw material in the container is preferably 50% or more, and may be 50% or more and 80% or less. The filling density is a value calculated as a relative density based on the measured density of the filling product calculated on the basis of the following formula and the true density of chromium (7.19 g/cm$^3$).

Measured density=weight (g) of filling product loaded in can/volume (cm$^3$) of can Filling density=measured density/true density of chromium The firing temperature T2 may be any temperature at which the electrolytic chromium flakes are sintered but is preferably T1−100 (° C.) or higher and T1+100 (° C.) or lower (preferably satisfies (T2 (° C.)=T1±100 (° C.)) with respect to the heating temperature T1 of the electrolytic chromium flakes. In this case, the electrolytic chromium flakes can be sintered while abnormal grain growth is suppressed, and generation of strain is suppressed in the firing step.

The pressure in the firing step is not particularly limited as long as the pressure is within a range in which sintering of the electrolytic chromium flakes proceeds; however, from the viewpoint of effectively reducing air voids to improve the density, the pressure in the firing step is preferably 50 MPa or more, and more preferably 100 MPa or more.

From the viewpoint of protecting the apparatus, the pressure in the firing step is preferably 400 MPa or less, and more preferably 300 MPa or less. A preferred pressure in the firing step is, for example, 50 MPa or more and 400 MPa or less, or 100 MPa or more and 200 MPa or less.

The holding time in the firing step (holding time at the firing temperature) is not particularly limited; however, from the viewpoint that sintering proceeds stably, the holding time is preferably one hour or more, and more preferably three hours or more.

From the viewpoint of controlling the grain size, the holding time in the firing step is preferably ten hours or less, and more preferably five hours or less. A preferred holding time is, for example, one hour or more and ten hours or less, or three hours or more and five hours or less.

(Other Steps)

The filling product fired in the firing step (heat-treated product) may be subjected to machining as needed. Unless machining is performed, the fired filling product serves as a chromium sintered body.

If machining is performed, a product obtained by firing the filling product and further subjecting the fired filling product to machining serves as a chromium sintered body.

An oxide may be formed on a surface of the heat-treated product (chromium sintered body) obtained in the firing step, and the surface tends to have a large surface roughness. Therefore, surface grinding is preferably performed as machining. The method is not particularly limited but may be, for example, grinding with a surface grinder. In order to remove oxidation scale on the surface of the heat-treated product, it is preferable to cut a portion extending from the surface to a depth of 0.5 mm or more.

If an affected layer is formed by machining, the thickness of the affected layer is preferably 100 μm or less, more preferably 10 μm or less, and particularly preferably 5 μm or less.

When the thickness of the affected layer is 100 μm or less, generation of particles due to separation of the affected layer is further suppressed. The thickness of the affected layer is, for example, 0 μm or more and 100 μm or less, or 0 μm or more and 5 μm or less.

The "affected layer" refers to a layer on the front surface side of the chromium sintered body, in which fine cracks are formed by machining.

If a flaw is present in the chromium sintered body, the maximum size of the flaw is preferably 1 mm or less.

Herein, the "flaw" refers to an uneven portion formed on a surface of the chromium sintered body and includes, for example, a linear dent and a mark formed by collision with an object. The "size of a flaw" refers to a value of the distance between two points present on the same flaw when the distance between the two points becomes maximum in plan view of the flaw.

<Sputtering Target>

A target according to the present disclosure includes the above-described chromium sintered body. The target according to the present disclosure may further include a backing plate bonded to the above-described chromium sintered body.

Since the sputtering target according to the present disclosure includes the above-described chromium sintered body, the sputtering target has a low oxygen content and enables thickness uniformity of a chromium film to be improved when the chromium film is formed by a sputtering method.

The target may further include a joining material between the chromium sintered body and the backing plate. Various materials can be used as the joining material, but indium is preferred from the viewpoint of suppressing thermal diffusion and thermal expansion during sputtering.

A joining ratio (bonding ratio) at the interface between the chromium sintered body and the backing plate is not particularly limited; however, the joining ratio is preferably 95% or more, more preferably 99% or more, and particularly preferably 99.5% or more. The "joining ratio" refers to a ratio calculated by the following formula.

Joining ratio (%)=100×$S1/S$ (In the formula, S represents an area of a surface where, in a target, a chromium sintered body and a backing plate overlap when the chromium sintered body and the backing plate are viewed in the thickness direction of the backing plate, and Si represents an area of a portion where the chromium sintered body and the backing plate are bonded together.)

When the joining ratio is 95% or more, thermal conduction can be accelerated to suppress the generation of particles and a change in properties of the chromium sintered body due to heat generated during sputtering. The joining ratio is preferably high but may be 95% or more and 100% or less, 99% or more and 100% or less, or 99.5% or more and 100% or less.

Warpage of the target is preferably as small as possible, specifically, preferably 0.5 mm or less, and is, for example, 0 mm or more and 0.5 mm or less, 0.05 mm or more and 0.3 mm or less, or 0.10 mm or more and 0.15 mm or less.

The "warpage" refers to the distance defined as follows. A chromium sintered body is placed on a flat surface with a sputtering surface facing down. In this case, the distance from a contact point between the sputtering surface and the flat surface to a point located, on the front surface of the sputtering surface, at a position farthest from the flat surface is referred to as the warpage.

<Method for Producing Sputtering Target>

A method for producing a sputtering target according to the present disclosure includes a step of producing a chromium sintered body by the above-described method for producing a chromium sintered body.

This method enables the production of a sputtering target which has a low oxygen content and with which thickness uniformity of a chromium film can be improved when the chromium film is formed by a sputtering method.

The method for producing a target according to the present disclosure may further include a step of bonding a backing plate to the chromium sintered body described above.

The method for joining the chromium sintered body and the backing plate may be at least one selected from the group consisting of diffusion bonding, solder bonding, and friction stir welding; however, the joining method is not particularly limited as long as the chromium sintered body and the backing plate are joined together with a strength enough to provide for sputtering.

Figure 6:
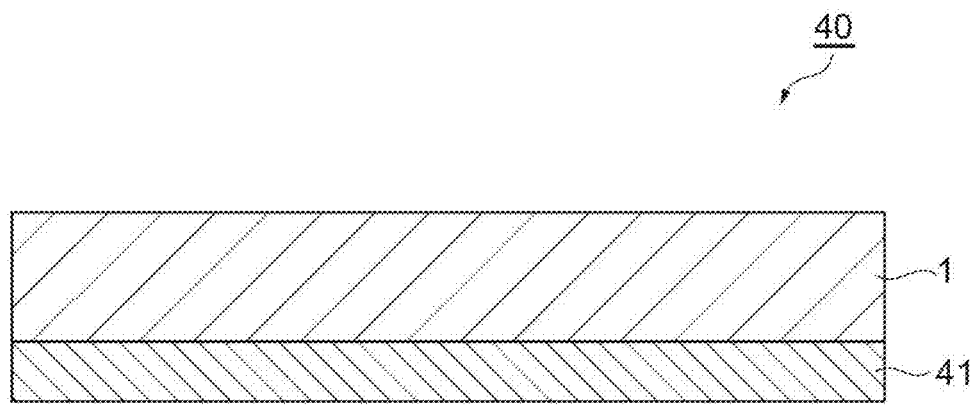
FIG. 6 is a sectional view illustrating an example of a sputtering target obtained by a method for producing a sputtering target according to the present disclosure.

FIG. 6 is a sectional view illustrating an example of a sputtering target obtained by the method for producing a sputtering target according to the present disclosure. A sputtering target 40 illustrated in FIG. 6 includes a chromium sintered body 1 and a backing plate 41.

<Method for Producing Substrate with Chromium Film>

A method for producing a substrate with a chromium film according to the present disclosure includes forming a chromium film on a substrate by a sputtering method using the target described above to produce a substrate with the chromium film.

According to the method for producing a substrate with a chromium film according to the present disclosure, the above sputtering target is used; therefore, in the formation of a chromium film on a substrate by a sputtering method, a chromium film having a low oxygen content can be formed, and thickness uniformity of the chromium film can be improved.

Figure 7:
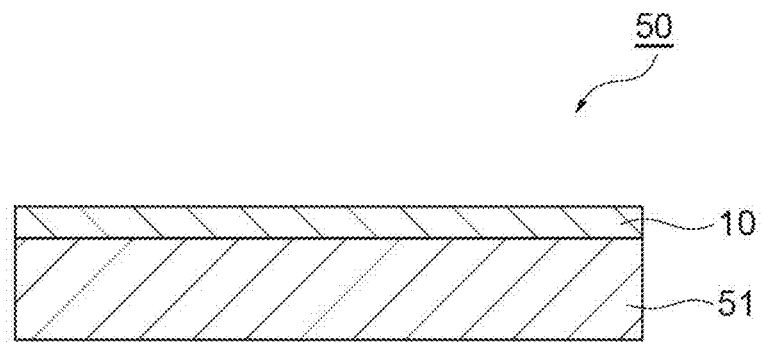
FIG. 7 is a sectional view illustrating an example of a substrate with a chromium film, the substrate being obtained by a method for producing a substrate with a chromium film according to the present disclosure.

FIG. 7 is a sectional view illustrating an example of a substrate with a chromium film, the substrate being obtained by the method for producing a substrate with a chromium film according to the present disclosure. A substrate 50 with a chromium film illustrated in FIG. 7 includes a chromium film 10 and a substrate 51 supporting the chromium film 10.

The substrate is not particularly limited, but is, for example, at least one of a glass substrate and a quartz substrate, and is preferably a glass substrate.

The temperature of the substrate during the formation of the chromium film is not particularly limited but may be, for example, room temperature (25° C.).

The type of gas in the atmosphere during the film deposition is not particularly limited as long as the gas causes sputtering upon discharging, and the gas may be, for example, argon.

The gas pressure during the film deposition is not particularly limited but may be, for example, 0.2 Pa or more and 2 Pa or less.

The power density during the film deposition is not particularly limited but may be, for example, 2.5 W/cm$^2$ or more and 50 W/cm$^2$ or less, or 5 W/cm$^2$ or more and 10 W/cm$^2$ or less.

The number of times of abnormal discharge during the film deposition is preferably small, is preferably 3 times/h or less, and more preferably 1 time/h or less, and is, for example, 0 times/h or more and 3 times/h or less, or 0 times/h or more and 1 time/h or less.

A standard deviation cv of the thickness of the chromium film is preferably as small as possible, specifically, preferably 10 or less, and is, for example, 0 or more and 10 or less, or 1 or more and 8 or less. NU defined by the formula below is also preferably as small as possible, specifically, preferably 10% or less, more preferably 8% or less, and is, for example, 0% or more and 10% or less, or 1% or more and 8% or less.

NU (%)=(standard deviation σ of film thickness (nm)/average value of film thickness (nm))×100

Figure 8:
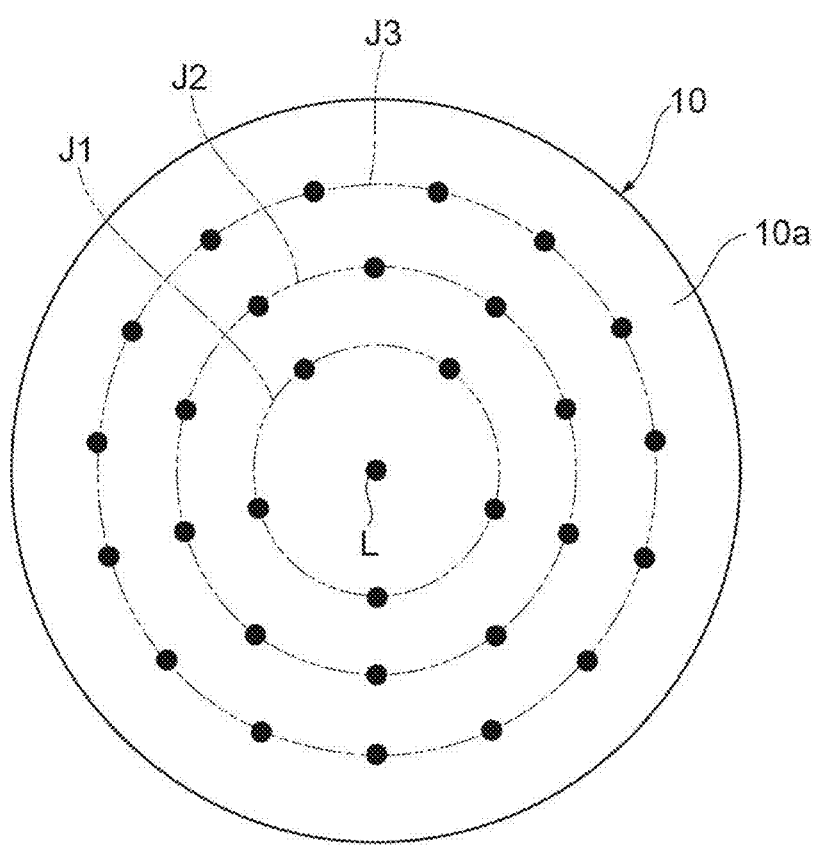
FIG. 8 is a view illustrating measurement points on a surface of a chromium film of a substrate with the chromium film.

The film thickness is measured with a film thickness measuring device (DEKTAK) on a surface 10*a* of a chromium film 10 of a substrate with the chromium film. As illustrated in FIG. 8, the measurement of the film thickness is performed at a total of 31 measurement points of a certain point L on the surface 10*a* of the chromium film 10, and 5 points, 10 points, and 15 points that are respectively arranged on three concentric circles J1, J2, and J3 centered on the point L. Here, the concentric circle J3, which is the outermost circle among the three concentric circles J1, J2, and J3, is arranged so as to surround a region that accounts for 60% or more of the total area of the surface 10*a* of the chromium film 10. The "average value of film thickness" refers to the arithmetic mean of the film thicknesses measured as described above. The "standard deviation cv of film thickness" refers to a standard deviation obtained by determining a film thickness distribution from the measured film thicknesses, and calculating a standard deviation from the film thickness distribution.

EXAMPLES

The present disclosure will be described in more detail with reference to Examples and Comparative Examples, but the present disclosure is not limited to the Examples below.

Methods for measuring parameters used in Examples and Comparative Examples are as follows.

<Average Particle Size of Raw Material>

The average particle size of a raw material was the median particle size when the raw material was sieved through a multi-stage sieve on the basis of JISZ8815.

<Oxygen Content>

The oxygen contents in a raw material and a chromium sintered body were measured with an oxygen/nitrogen analyzer (apparatus name: ON736, manufactured by LECO Corporation).

<Impurity Content>

The metal impurity contents in a raw material and a chromium sintered body were measured by glow discharge mass spectrometry (GDMS) to determine Li, Be, B, Na, Mg, Al, Si, P, K, Ca, Sc, Ti, V, Mn, Fe, Co, Ni, Cu, Zn, Ga, Ge, As, Se, Br, Rb, Sr, Y, Zr, Nb, Mo, Ru, Rh, Pd, Ag, Cd, In, Sn, Sb, Te, Cs, Ba, La, Ce, Pr, Nd, Sm, Eu, Gd, Tb, Dy, Ho, Er, Tm, Yb, Lu, Hf, Ta, W, Re, Os, Ir, Pt, Au, Hg, Tl, Pb, Bi, Th, and U contents. The non-metal impurity contents (sulfur and carbon contents) were measured by instrumental gas analysis (IGA).

<Filling Density>

The filling density was calculated as a relative density based on the measured density of a filling product calculated on the basis of the following formula and the true density of chromium (7.19 g/cm³).

Measured density=weight (g) of filling product loaded in can/volume (cm³) of can Filling density=measured density/true density of chromium<Average KAM value>

As illustrated in FIG. 1, an annular region on the circular front surface 11 of the sintered body 1 was defined as an observation region A. For a measurement portion B (see the hatched portion in FIG. 2) in the observation region A in a section of the sintered body, the microstructure of the sintered body was observed with SEM-EBSD (scanning electron microscope-electron backscatter diffraction detector, SEM: manufactured by JEOL Ltd., EBSD: manufactured by Oxford Instruments) under measurement conditions below and using programs below. Subsequently, KAM values in all grains (120±20 grains) observed without discontinuation of their contours in the measurement portion B were measured, and the arithmetic mean of the KAM values was used as the average KAM value.

(Measurement Conditions)
  Beam conditions: Accelerating voltage 20 kV, Incident beam current 100 µA
  Work distance: 10 mm
  Step width: 5 µm
(Programs Used)
  Measurement program: AZtec
  Analysis program: AZtec Crystal <Average Grain Size>

A sintered body was cut, polished, and then subjected to electrolytic etching. For grains (crystal grains) at 100 or more points (120±10 points) observed by SEM, grain sizes were measured by a diameter measurement method, and a grain size distribution of the grain sizes was prepared on the basis of the grain sizes. The median (D50) in the grain size distribution was used as the average grain size of the grains constituting the sintered body.

<Average Aspect Ratio>

A sintered body was cut, polished, and then subjected to electrolytic etching. For grains (crystal grains) at 100 or more points (120±10 points) observed by SEM, aspect ratios (=long axis/short axis) in the case where the grains were approximated by ellipses were calculated, and the arithmetic mean of the aspect ratios was determined as the average aspect ratio.

<Relative Density of Sintered Body>

The relative density of a chromium sintered body was measured by the following method. Specifically, a measured density of the chromium sintered body was measured in accordance with JIS R 1634, and the measured density was divided by the true density of chromium to calculate the relative density. The true density of chromium was assumed to be 7.19 g/cm³.

<Vickers Hardness>

The Vickers hardness was measured in accordance with JIS-Z-2244-1. The conditions for measuring the Vickers hardness were as follows.
  Measurement sample: 5±0.5 mm (sample thickness)
  Measuring load: 10 kgf <Average Value and Standard Deviation of Film Thickness>

The film thicknesses were measured with a film thickness measuring device (DEKTAK) on a surface of a chromium film of a substrate with the chromium film, and the average value thereof was determined as the average value of the film thickness. As illustrated in FIG. 8, the measurement of the film thicknesses was performed at a total of 31 measurement points of a certain point L on the surface 10a of the chromium film 10, and 5 points, 10 points, and 15 points that were respectively arranged on three concentric circles J1, J2, and J3 centered on the point L. At this time, the concentric circle J3, which was the outermost circle among the three concentric circles J1, J2, and J3, accounted for 72% of the total area of the surface 10a of the chromium film 10.

In addition, a film thickness distribution was determined from the measured film thicknesses, and the standard deviation was calculated from the film thickness distribution.

<Abnormal Discharge>

Abnormal discharge was detected with an arc counter. The number of times abnormal discharge was detected during film deposition was divided by the film deposition time to determine the number of times of abnormal discharge per hour.

Example 1

Commercially available electrolytic metal chromium flakes (30 kg) having a purity of 99.995% (4N5) and having the average particle size, etc. shown in Table 1 were used as a starting raw material. The electrolytic metal chromium flakes were heat-treated in an argon gas atmosphere at 1,200° C. for 10 hours.

Next, the heat-treated starting raw material was loaded into a can (400 mm×400 mm×200 mm) made of soft iron so as to have the filling density shown in Table 2, and the resulting filling product was vacuum-sealed and then fired by HIP under the firing conditions shown in Table 2. After firing, machining was performed to obtain a chromium sintered body (ingot) with a size of 216 mm in diameter× 6.35 mm.

Next, the obtained chromium sintered body was bonded to a backing plate with indium as a joining material to prepare a target.

Sputtering was performed using the obtained target under the sputtering conditions shown in Table 4 to deposit a chromium film (chromium sputtered film) on a glass substrate. Thus, a substrate with a chromium film was produced. During the film deposition, the substrate temperature was room temperature (RT).

Example 2

Heat treatment was performed by the same method as in Example 1 except that electrolytic metal chromium flakes having the average particle size, etc. shown in Table 1 were used as electrolytic metal chromium flakes. A chromium sintered body, a target, and a substrate with a chromium film were produced as in Example 1 except that the electrolytic metal chromium flakes after the heat treatment were loaded so as to have the filling density shown in Table 2 and subjected to HIP under the firing conditions shown in Table 2.

Example 3

Heat treatment was performed using electrolytic metal chromium flakes having the average particle size, etc. shown in Table 1 as electrolytic metal chromium flakes at the heating temperature shown in Table 1. A chromium sintered body and a target were produced as in Example 1 except that the electrolytic metal chromium flakes after the heat treatment were loaded so as to have the filling density shown in Table 2 and subjected to HIP under the firing conditions shown in Table 2.

Comparative Example 1

A commercially available chromium powder (average particle size: 150 μm) (125 kg) having a purity of 99.99% (4N) and having the properties shown in Table 1 was prepared as a starting raw material.

The chromium powder was loaded into a can (400 mm×400 mm×200 mm) made of soft iron without performing heat treatment so as to have the filling density shown in Table 2, and the resulting filling product was vacuum-sealed and then fired by HIP under the firing conditions shown in Table 2. Subsequently, the obtained HIP-treated body was subjected to machining to obtain a chromium sintered body (ingot) with a size of 216 mm in diameter×6.35 mm.

The evaluation results of the obtained chromium sintered body are shown in Table 2.

Comparative Example 2

A chromium sintered body was prepared as in Example 1 except that electrolytic metal chromium flakes having the properties shown in Table 1 were used, loaded into a can made of soft iron without performing heat treatment so as to have the filling density shown in Table 2, and subjected to HIP under the firing conditions shown in Table 2.

Comparative Example 3

Metal chromium flakes having the average particle size, etc. shown in Table 1 were used as a raw material.

Next, this raw material was charged into a melting furnace without performing heat treatment in advance, melted by heating to a temperature of 1,950° C. or higher, and then cooled to obtain a melt product.

Next, the melt product was subjected to machining to obtain an ingot with a size of 216 mm in diameter×6.35 mm.

Table 1 shows the heat treatment condition and properties of the starting raw materials, Table 2 shows the firing conditions and evaluation results of the chromium sintered bodies, Table 3 shows the evaluation results of the targets, and Table 4 shows the film deposition conditions and evaluation results of film deposition properties. Note that since heat treatment was not performed for metal chromium in Comparative Examples 1 to 3, the "heating temperature" in Table 1 is indicated by "-". In Table 2, "-" in Comparative Example 2 indicates that the measurement was not performed. Note that "ppm" in Tables 1 and 2 represents "ppm by mass". In Comparative Example 3, since melting was performed instead of firing for metal chromium serving as a raw material, the column of the "firing conditions" of Table 2 is indicated as "melt product".

TABLE 1

| | Heat treatment condition Heating temperature ° C. | Starting raw material | | | |
|---|---|---|---|---|---|
| | | Average particle size mm | Oxygen content ppm | Metal impurity content ppm | Shape |
| Example 1 | 1200 | 13.2 | 8 | 90 | Flake |
| Example 2 | 1200 | 7.8 | 17 | 90 | Flake |
| Example 3 | 1300 | 8.7 | 15 | 110 | Flake |
| Comparative Example 1 | — | 0.15 | 3500 | 150 | Powder |
| Comparative Example 2 | — | 7.8 | 17 | 110 | Flake |
| Comparative Example 3 | — | 7.8 | 17 | 100 | Flake |

TABLE 2

| | Sintered body | | | | | | | | |
|---|---|---|---|---|---|---|---|---|---|
| | Firing conditions | | | | Physical properties | | | | |
| | Filling density % | Firing temperature ° C. | Pressure MPa | Holding time hr | Average KAM value ° | Average grain size μm | Average aspect ratio | Relative density % | Vickers hardness HV10 | Oxygen content ppm |
| Example 1 | 58 | 1300 | 118 | 4 | 0.24 | 278 | 1.08 | 99.8 | 158 | 8 |
| Example 2 | 54 | 1200 | 118 | 4 | 0.40 | 222 | 1.08 | 99.7 | 122 | 20 |
| Example 3 | 56 | 1300 | 118 | 4 | 0.23 | 318 | 1.06 | 99.8 | 115 | 17 |
| Comparative Example 1 | 45 | 1230 | 118 | 2 | 0.65 | 85 | 1.21 | 99.2 | 124 | 123 |
| Comparative Example 2 | 54 | 1300 | 120 | 4 | 2.5 | 350 | 2.00 | — | — | 55 |
| Comparative Example 3 | | Melt product | | | 2.1 | 3160 | 1.42 | 99.8 | 110 | 20 |

TABLE 2-continued

|  | Sintered body Impurity content | | | | | | | | |
|---|---|---|---|---|---|---|---|---|---|
|  | Sulfur ppm | Carbon ppm | Total of metals ppm | Na ppm | K ppm | Mg ppm | Ca ppm | Fe ppm | Pb ppm |
| Example 1 | 10 | 12 | 98 | 5.34 | 0.47 | 0.03 | 1.11 | 15.7 | 0.08 |
| Example 2 | 10 | 10 | 92 | 3.20 | 0.29 | 0.02 | 0.66 | 17.2 | 0.10 |
| Example 3 | 10 | 10 | 121 | 4.79 | 0.47 | 0.02 | 0.58 | 15.7 | 0.09 |
| Comparative Example 1 | 12 | 19 | 172 | 7.38 | 0.82 | 0.20 | 1.81 | 61.6 | 0.06 |
| Comparative Example 2 | — | — | — | — | — | — | — | — | — |
| Comparative Example 3 | 10 | 20 | 98 | 0.71 | 0.06 | 0.02 | 0.27 | 24.0 | 0.01 |

TABLE 3

|  | Target | | | |
|---|---|---|---|---|
|  | Joining ratio % | Thickness of joining material mm | Warpage mm | Thickness of affected layer μm |
| Example 1 | 99.0 | 0.2 | 0.10 | 0 |
| Example 2 | 99.7 | 0.2 | 0.12 | — |
| Example 3 | 99.8 | 0.2 | 0.20 | 0 |

TABLE 4

|  | Film deposition conditions | | | Film deposition properties | | | |
|---|---|---|---|---|---|---|---|
|  |  |  |  |  | Standard | | |
|  | Gas type | Gas pressure Pa | Power density W/cm$^2$ | Film thickness nm | deviation σ of film thickness nm | NU % | Abnormal discharge times/h |
| Example 1 | Ar | 0.5 | 7.4 | 103.9 | 7.68 | 7.39 | 0.8 |
| Example 2 | Ar | 0.5 | 7.4 | 102.8 | 5.21 | 5.07 | 2 |

From the results shown in Table 4, it was confirmed that the chromium sintered bodies of Examples 1 and 2 enabled the production of a sputtering target with which thickness uniformity of a chromium film could be improved when the chromium film was formed by a sputtering method, and had a low oxygen content.

REFERENCE SIGNS LIST

1 sintered body
10 metal-Si based particle
11 front surface
12 back surface
13 section
A observation region
B measurement portion

What is claimed is:

1. A method for producing a chromium sintered body, the method comprising:
  a heat treatment step of heat-treating electrolytic chromium flakes at 1,200° C. or higher and 1,400° C. or lower, wherein the electrolytic chromium flakes have a purity of chromium of 99.95% or more; and
  a firing step of, after the heat treatment step, filling a container with the electrolytic chromium flakes and firing a resulting filling product by hot isostatic pressing,
  wherein a holding time in the firing step is three hours or more and ten hours or less.

2. The method for producing a chromium sintered body according to claim 1, wherein the electrolytic chromium flakes are unground electrolytic chromium flakes.

3. The method for producing a chromium sintered body according to claim 1, wherein the electrolytic chromium flakes have an average particle size of 250 μm or more.

4. A method for producing a chromium sintered body, the method comprising:
  a heat treatment step of heat-treating electrolytic chromium flakes, at 1,200° C. or higher and 1,400° C. or lower, wherein the electrolytic chromium flakes have an oxygen content of 100 ppm by mass or less; and
  a firing step of, after the heat treatment step, filling a container with the electrolytic chromium flakes and firing a resulting filling product by hot isostatic pressing,
  wherein a holding time in the firing step is three hours or more and ten hours or less.

5. The method for producing a chromium sintered body according to claim 1, wherein the electrolytic chromium flakes have a metal impurity content of 130 ppm by mass or less.

6. The method for producing a chromium sintered body according to claim 1, wherein the heat treatment step includes heat-treating the electrolytic chromium flakes at 1,200° C. or higher and 1,300° C. or lower.

7. The method for producing a chromium sintered body according to claim 1, wherein, in the heat treatment step, an atmosphere of heat treatment is an inert gas atmosphere.

8. The method for producing a chromium sintered body according to claim 1, wherein, in the heat treatment step, an atmosphere of heat treatment is an argon atmosphere.

9. The method for producing a chromium sintered body according to claim 1, wherein, in the firing step, a firing temperature of the filling product is T1−100 (° C.) or higher and T1+100 (° C.) or lower, where T1 (° C) represents a heating temperature of the electrolytic chromium flakes in the heat treatment step.

10. The method for producing a chromium sintered body according to claim 1, wherein a pressure in the firing step is 50 MPa or more.

11. The method for producing a chromium sintered body according to claim 1, wherein, in the firing step, a filling density of the electrolytic chromium flakes in the container is 50% or more.

12. The method for producing a chromium sintered body according to claim 1,
wherein the chromium sintered body includes grains, the grains have an average KAM value of 2° or less, and the grains have an average grain size of more than 150 μm and 400 μm or less.

13. The method for producing a chromium sintered body according to claim 1, wherein the chromium sintered body has an oxygen content of 100 ppm by mass or less and a relative density of higher than 99.6%.

14. The method for producing a chromium sintered body according to claim 1, wherein the chromium sintered body has a Vickers hardness of 100 HV or more.

15. The method for producing a chromium sintered body according to claim 1, wherein the chromium sintered body has a total metal impurity content of 100 ppm by mass or less.

16. The method for producing a chromium sintered body according to claim 12, wherein the grains have an average aspect ratio of 1 or more and 1.8 or less.

17. A method for producing a sputtering target, the method comprising a step of producing a chromium sintered body by the method for producing a chromium sintered body according to claim 1.

18. A method for producing a substrate with a chromium film, the method comprising:
forming a chromium film on a substrate by a sputtering method using a sputtering target obtained by the method for producing a sputtering target according to claim 17 to produce a substrate with a chromium film.

19. The method for producing a chromium sintered body according to claim 1, wherein the electrolytic chromium flakes have a purity of chromium of 99.99% or more.

* * * * *